(12) United States Patent
Duwel et al.

(45) Date of Patent: Jun. 8, 2010
(10) Patent No.: US 7,733,124 B1

(54) METHOD AND APPARATUS FOR PLD HAVING SHARED STORAGE ELEMENTS

(75) Inventors: Keith Duwel, San Jose, CA (US); Michael D. Hutton, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 336 days.

(21) Appl. No.: 11/766,817

(22) Filed: Jun. 22, 2007

(51) Int. Cl.
*H03K 19/177* (2006.01)

(52) U.S. Cl. .......................... 326/40; 326/46

(58) Field of Classification Search ............. 326/38–41, 326/46, 47
See application file for complete search history.

(56) References Cited

U.S. PATENT DOCUMENTS 5,349,250 A * 9/1994 New .............................. 326/44
6,288,570 B1 * 9/2001 New .............................. 326/41

* cited by examiner

*Primary Examiner*—Daniel D Chang
(74) *Attorney, Agent, or Firm*—Martine Penilla & Gencarella, LLP

(57) ABSTRACT

A programmable logic device (PLD) includes a core region having a plurality of logical array blocks (LABs). Each one of the plurality of logical array blocks include a plurality of logic elements capable of communicating with each other through interconnections defined within each logical array block. The logic elements include a look up table (LUT), wherein a LUT of a first logic element and a LUT of a second logic element share a register. In one embodiment, more than two logic elements may share a register. Thus, the embodiments provide for the ability to vary sequential logic, e.g., registers, instead of rigidly fixing the sequential logic and consequently the ratio of combinatorial logic to sequential logic.

22 Claims, 5 Drawing Sheets

US 7,733,124 B1

METHOD AND APPARATUS FOR PLD HAVING SHARED STORAGE ELEMENTS

BACKGROUND

Programmable logic devices are desirable because of the flexibility these devices offer. However, there is a continuing quest to provide additional flexibility whenever possible. Of course, added flexibility typically comes at a cost, usually in terms of additional overhead. One area where programmable logic devices have been fairly consistent in their design has been the ratio between combinatorial logic and sequential logic elements. Combinatorial logic elements, in one embodiment, refer to the lookup tables and associated support logic, while sequential logic refers to storage elements and the associated support logic. The ability for a designer to adjust or modify the combinatorial logic comes with a finer granularity relative to the ability to adjust or modify the sequential logic. For example, when considering a storage element such as a flip-flop, a designer can select one or two as a flip-flop is an element that cannot be further divided.

As a result, there is a need to solve the problems of the prior art to provide a technique for adjusting the ratio of combinatorial logic and sequential logic while minimizing any overhead incurred.

SUMMARY

Broadly speaking, the present invention fills these needs by providing an architecture and technique for sharing a register between logic elements of a programmable logic device. It should be appreciated that the present invention can be implemented in numerous ways, including as a method, a system, or an apparatus. Several inventive embodiments of the present invention are described below.

In one aspect of the invention, a programmable logic device (PLD) includes a core region having a plurality of logical array blocks (LABs). Each one of the plurality of logical array blocks include a plurality of logic elements capable of communicating with each other through interconnections defined within each logical array block. The logical elements include a look up table (LUT), wherein a LUT of a first logic element and a LUT of a second logic element share a register. In one embodiment, more than two logic elements may share a register. Thus, the embodiments provide for the ability to vary sequential logic, e.g., registers, instead of rigidly fixing the sequential logic and consequently the ratio of combinatorial logic to sequential logic.

In another aspect of the invention, a method for sharing a storage element between logical elements of a programmable logic device (PLD) is provided. The method includes the method operations of receiving a plurality of inputs into a first lookup table (LUT) region of a first logic element and receiving a plurality of inputs into a second LUT region of a second logic element. The received inputs are combinatorially processed through corresponding lookup tables. The output from the first LUT region is transmitted to a storage element dedicated to the first logic element while another output from the first LUT region is transmitted to a storage element shared by the first logic element and the second logic element.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Figure 1:
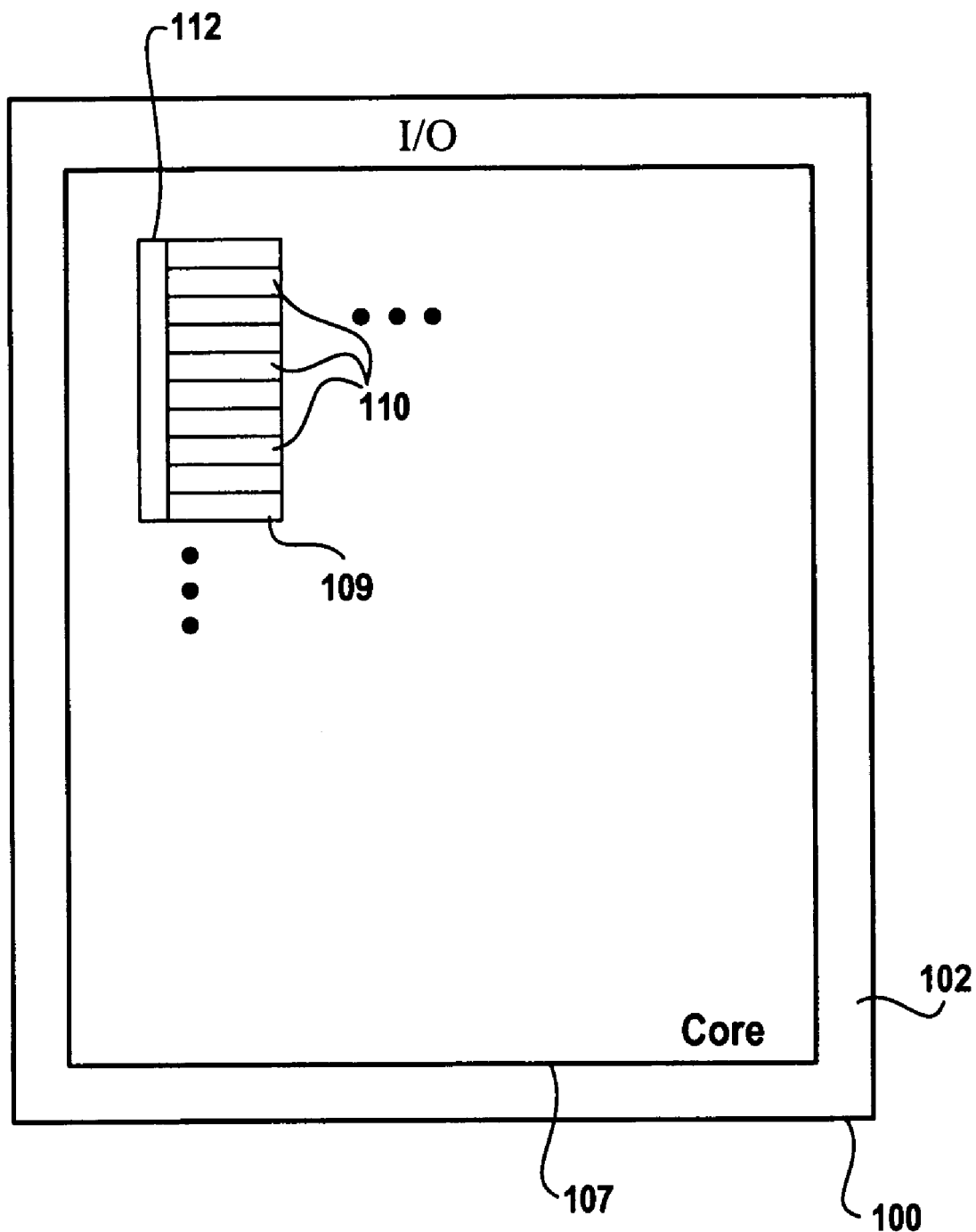
FIG. 1 is a high-level schematic diagram illustrating a programmable logic device architecture in accordance with one embodiment of the invention.

An invention is described for a programmable logic device in which storage elements, e.g., registers, are shared with other logic elements to provide additional flexibility for the programmable logic device. It will be obvious, however, to one skilled in the art, that the present invention may be practiced without some or all of these specific details. In other instances, well known process operations have not been described in detail in order not to unnecessarily obscure the present invention.

The embodiments described herein relate to programmable logic devices (PLD), and more particularly to economical clustering of logic modules and related circuitry in the PLD. A PLD may include a large number of relatively small modules of programmable logic. For example, each such logic module (LM), also referred to as a logic element (LE), may include a look-up table (LUT), a register, which may be used for selectively registering an output signal of the LUT. A small amount of additional circuitry, which may be referred to as support logic, for determining whether or how the register is used, for selecting control signals for the register, etc., may be included. The LUT is programmable to produce an output signal that is any logical combination of functions of the inputs to the LUT. One skilled in the art will appreciate that the LE may be programmable with respect to whether and how the register is used, and what control signals e.g., clock, clock enable, clear, etc. are selected for application to the register.

In addition to the LE, a PLD typically includes programmable interconnection circuitry for conveying signals to, from, and/or between the LE in many different ways. This allows the relatively simple logic capabilities of individual LE to be concatenated to perform logic tasks of considerable complexity. Resources in PLDs, especially relatively large PLDs, typically are given a hierarchical organization. For example, the LEs in a PLD may be clustered in groups that may be called logic array blocks (LABs). The LEs in a LAB share certain resources associated with the LAB. These shared resources may include such things as LAB input multiplexers (LIM), which are programmable to select signals from nearby interconnection conductors so that those signals will be available as inputs to the LEs and the LAB. Another example of a resource that may be shared by the LEs in a LAB is so-called secondary signal selection circuitry. This secondary signal selection circuitry is programmable to select signals from nearby conductors so that these signals will be available as secondary signals e.g., register clock, clock enable, and clear signals, for use by the LEs in the LAB. Further details on an exemplary arrangement on LABs for a PLD, such as a field programmable gate array (FPGA) may be found in U.S. Pat. Nos. 7,176,718, 7,167,022, and 6,989,689, each of which are incorporated by reference.

Typically, the ratio of combinatorial logic elements to sequential elements is a fixed ratio. In certain circumstances it may be desirable to adjust the ratio of combinatorial logic to sequential elements if this ratio is not ideal. The use of different LEs having varying numbers of registers provides one attempt to address this issue, but along with this techniques comes added overhead and complexity. The embodiments described below provide a technique that enables adjusting the ratio of combinatorial logic and sequential elements in a manner that minimizes the overhead incurred.

FIG. 1 is a high-level schematic diagram illustrating a programmable logic device architecture in accordance with one embodiment of the invention. PLD 100 is constructed with input/output (I/O) ring 102 surrounding core region 107. I/O ring 102 may include a number of modules for communicating with external devices, e.g., a high speed serial interface, and other typical blocks within the I/O ring. Core region 107, which is surrounded by I/O ring 102, includes combinatorial and sequential logic. Within core region 107 are numerous logic blocks, which may include digital signal processing blocks, memory regions, etc. One of the basic building blocks for the programmable logic device 100 includes logic array block 109. In one embodiment, logic array block 109 may include a plurality of logic elements 110 and interconnection circuitry 112 for communication between the logic elements and external circuitry. Lookup tables within logic elements 110 are typically fixed relative to the registers which are in communication with these lookup tables. As described in more detail below, the embodiments herein provide a logic element where the amount and type of logic needed is capable of being combined with the amount of sequential elements needed for a given architecture. In essence, the embodiments described herein enable the sequential elements, e.g., the registers to be associated with a finer granularity.

Figure 2:
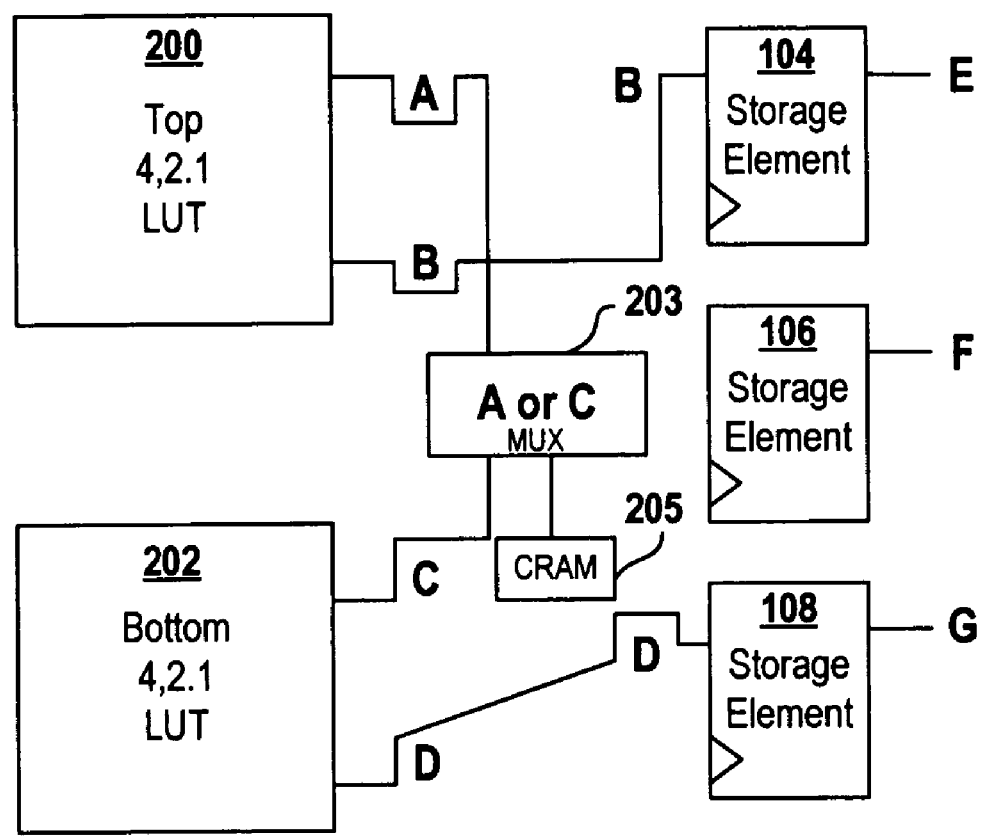
FIG. 2 is a simplified schematic diagram illustrating the sharing of two lookup tables, of two different logic elements, between a common register in accordance with one embodiment of the invention.

FIG. 2 is a simplified schematic diagram illustrating the sharing of two lookup tables, of two different logic elements, between a common register in accordance with one embodiment of the invention. Top LUT 200 outputs signals A and B, while bottom LUT 202 outputs signals C and D. Previously, register 104 was dedicated to top LUT 200 while register 108 was dedicated to bottom LUT 202. As mentioned above, one approach to address the need for additional storage elements included adding an additional storage element for top LUT 200. However, the different types of logic elements, i.e., logic element 110-1 having two dedicated registers and logic element 110-2 having one dedicated register, add complexity and overhead. The architecture depicted through FIG. 2 avoids the added overhead and complexity, with the introduction of storage element 106, which is shared through multiplexer 203. Multiplexer 203 selects between outputs A or C through a select signal provided by configuration random access memory (CRAM) bit 205.

Figure 3:
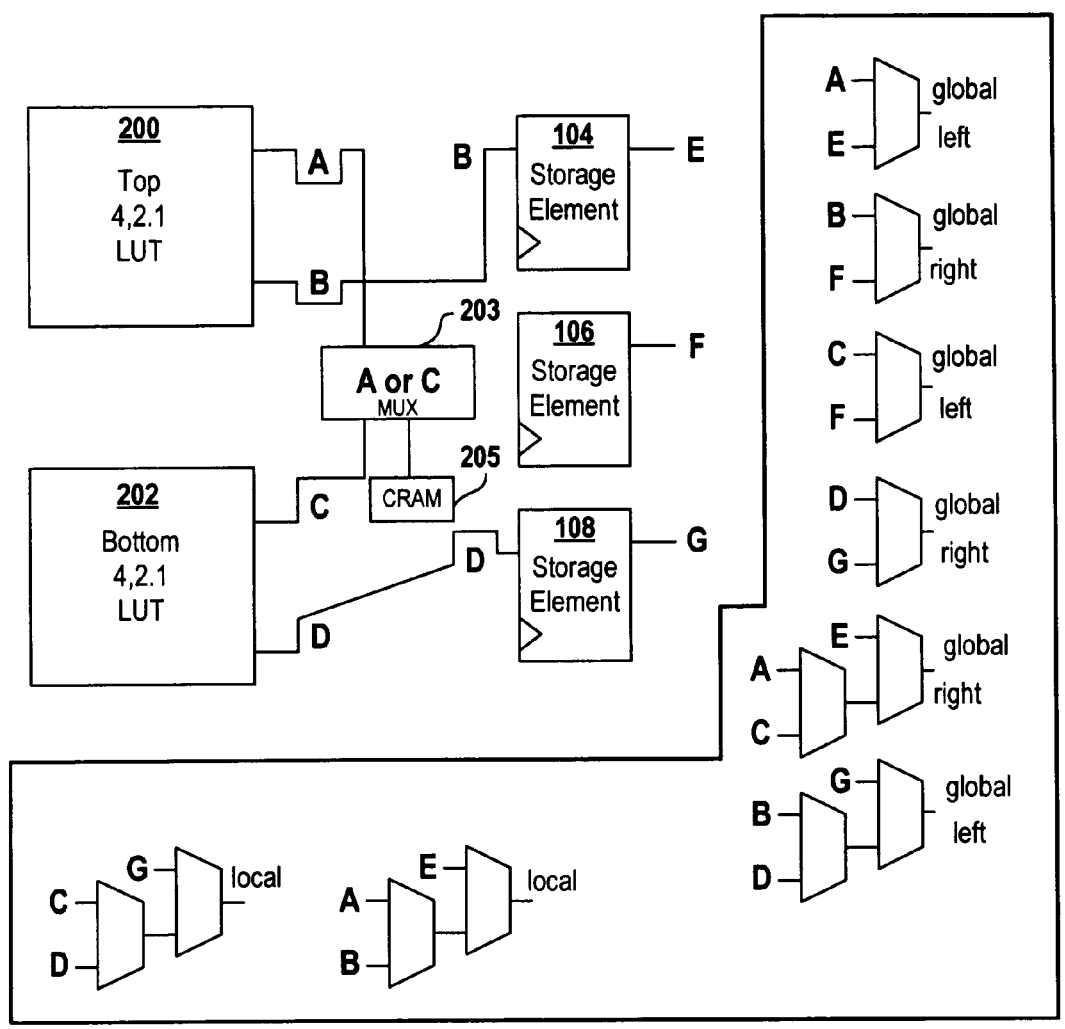
FIG. 3 is a more detailed diagram illustrating the multiplexing of the output signals provided through the sharing of the registers of FIG. 2 in accordance with one embodiment of the invention.

FIG. 3 is a more detailed diagram illustrating the multiplexing of the output signals provided through the sharing of the registers of FIG. 2 in accordance with one embodiment of the invention. As illustrated in FIG. 3, the output from each of the registers may be multiplexed with the combinatorial output from the look-up tables in order to provide a plurality of outputs to be selected from. As illustrated through output region 305, each LUT 200 and 202 and/or register 104, 106, and 108 output has two global pathways to be transmitted out. In addition, each LUT and/or register output drives one left-going (global) output, i.e., utilizes routing resources located to the left of the register, and one right going output, i.e., utilizes routing resources located to the right of the register. Each LUT and/or register is configured to drive one local output with the exception of signal F. In one embodiment, a local output will be routed to other logic elements within the same LAB, while a global output is routed to other LABs.

Figure 4:
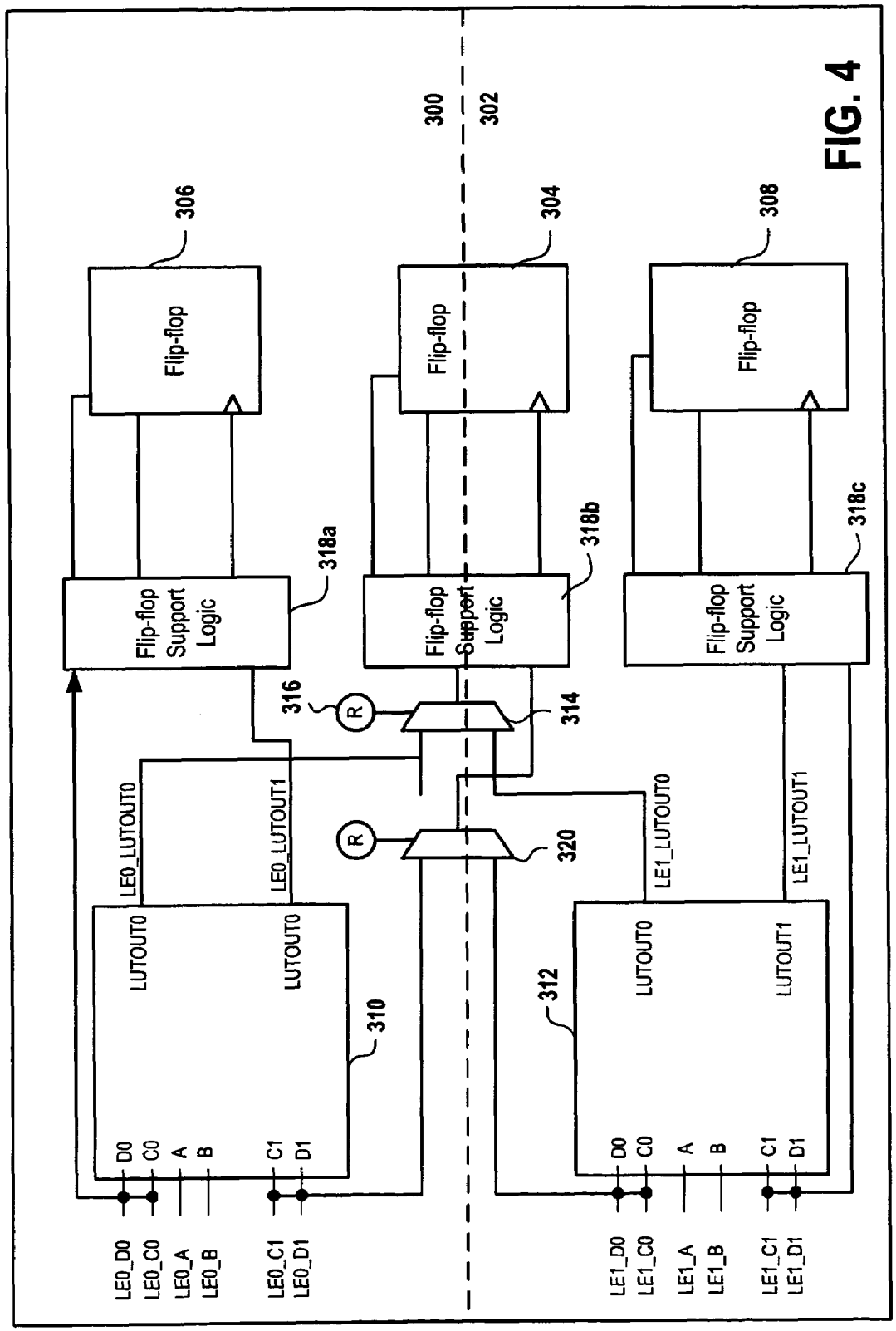
FIG. 4 is a more detailed schematic diagram illustrating the sharing of the registers between logic elements in accordance with one embodiment of the invention.

FIG. 4 is a more detailed schematic diagram illustrating the sharing of the registers between logic elements in accordance with one embodiment of the invention. Logic element 300 and logic element 302 share storage element 304, which may be a register. Logic element 300 also includes dedicated storage element 306, while logic element 302 includes dedicated storage element 308. Look-up table 310 and look-up table 312 are included within logic element 300 and logic element 302, respectively. As illustrated in FIG. 4, each of LUTs 310 and 312 have six inputs and two outputs. It should be appreciated that while LUTs 310 and 312 are illustrated with six inputs and two outputs, this is not meant to be limiting, as other types of LUTs with differing amounts of input and output combinations may be incorporated with the embodiments described herein. Furthermore LUT 310 and LUT 312 can be subdivided to contain multiple smaller LUTs as illustrated with reference to FIG. 5, and are depicted in FIG. 4 as a single LUT region for ease of illustration. The output from LUT 310 of FIG. 4 is provided to flip flop support logic 318a and another output is provided to multiplexer 314. The output provided to flip flop support logic 318a is available to register 306 which is dedicated to LUT 310. The output from LUT 310 that is transmitted to multiplexer 314 is available to the shared register 304. Similarly, LUT 312 provides outputs to flip flop selection circuitry 318c which becomes available to dedicated register 308 of LUT 312. The other output of LUT 312 is provided to register 314, and consequently becomes available to shared register 304. Multiplexer 314 selects between the output of LUT 310 or LUT 312 based on configuration random access memory (CRAM) bit 316. Flip flop support logic 318a-c provides the signal to the corresponding register which is then available for output in a combination of ways as will be illustrated with regard to FIG. 5. Multiplexer 320 is included so as to select between C1/D1 inputs and C0/D0 inputs of LUT 310 and LUT 312, respectively. A CRAM bit provides the select signal to determine which input to multiplexer 320 is output to flip-flop support logic 318b. It should be noted that FIG. 4 depicts logic elements 300 and 302 as sharing the resources of multiplexers 320 and 314, flip-flop support logic 318b and flip-flop 304 through the dotted line traversing through each of the aforementioned resources.

Figure 5:
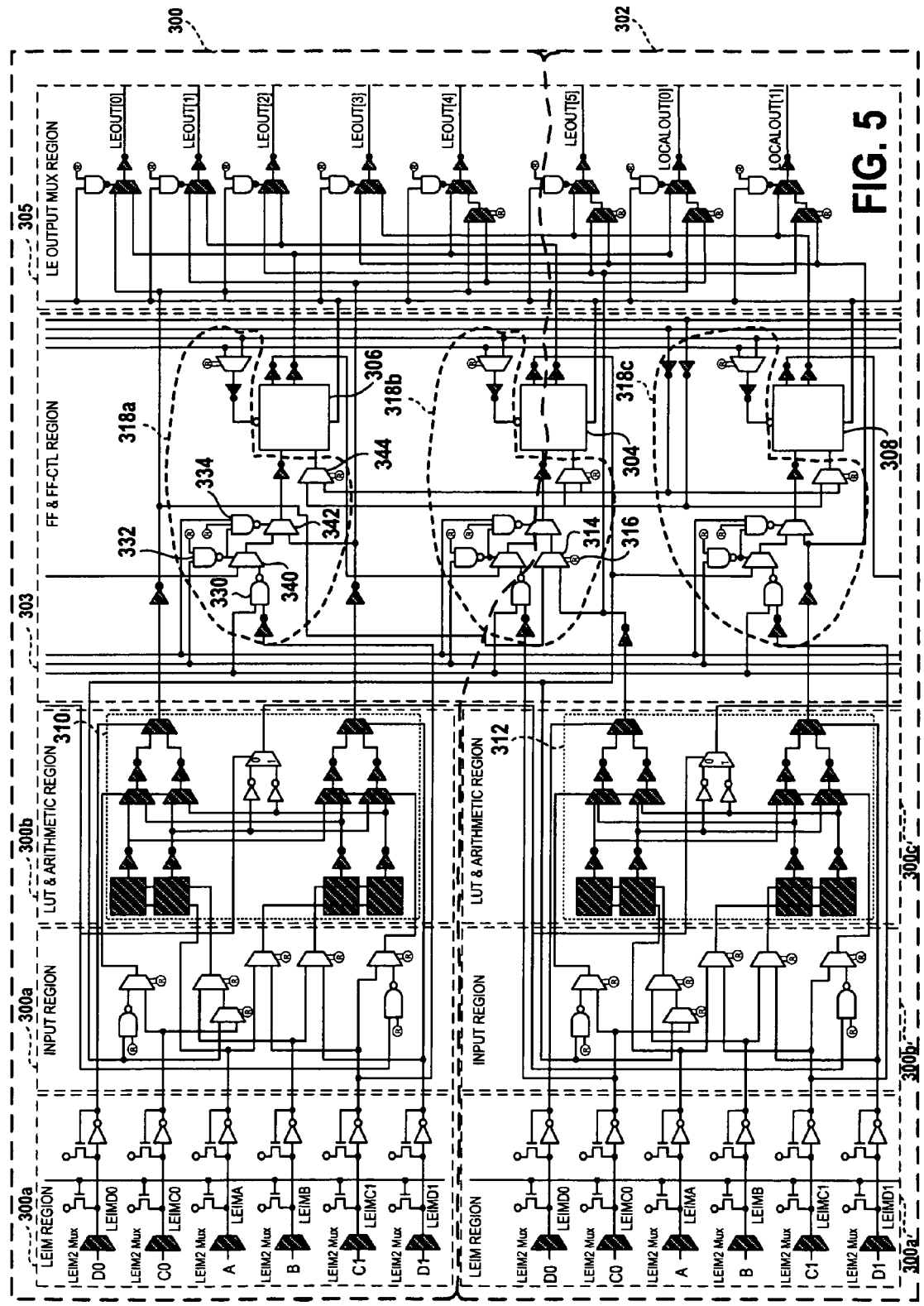
FIG. 5 is a more detailed schematic diagram illustrating the sharing of a register between logic elements in accordance with one embodiment of the invention.

FIG. 5 is a more detailed schematic diagram illustrating the sharing of a register between logic elements in accordance with one embodiment of the invention. Within each logic element 300 and 302 are logic element input multiplexer region (LEIM) 300a and 302a, input region 300b and 302b, look-up table region 300c and 302c, sequential region 303, and output region 305. LEIM regions 300a and 302a will input a signal into the corresponding input regions 300b and 302b for respective logic elements. Input regions 300b and 302b deliver and route the signal to respective destinations.

LUT regions 300c and 302c perform desired arithmetic and logic operations and provide signal output to sequential region 303. Sequential region 303, which includes registers 304, 306, and 308, and corresponding support logic 318a-c, provides output to output region 305. Through multiplexing logic output region 305 provides output from the corresponding logic element.

The circuitry within flip flop support logic regions 318a, b, and c, is illustrated with more detail in FIG. 5. That is, flip flop support logic 318a includes NAND gates 330, 332 and 334. Also included in flip flop support logic 318 are multiplexers 340, 342, 344, and 346, as well as three inverters. The logic for support logic regions 318b and 318c is similarly configured as explained above for region 318a. Register 304 is shared between logic element 300 and 302 through flip flop support logic 318b in combination with multiplexer 314. It should be appreciate that multiplexer 314 enables selection between an output of logic element 300 and an output of logic element 302. Thus, through the embodiments described herein, logic element 300 and logic element 302 may share register 304. That is, the strict ratio of combinatorial logic to sequential elements is adjusted by the addition and sharing of register 304. Accordingly, the embodiments described herein achieve a heterogeneous structure without requiring multiple logical array block types. Therefore, the architecture is more flexible and does not incur significant added overhead due to the simplicity of the design.

In one embodiment, a method for sharing a storage element between logical elements of a programmable logic device (PLD) is included. The method includes receiving a plurality of inputs into a first lookup table (LUT) region of a first logic element and receiving a plurality of inputs into a second LUT region of a second logic element. As illustrated with reference to FIGS. 4 and 5, 6 inputs may be received by each of the first and second LUT regions. Of course, different numbers of inputs, more or less than 6, can also be received. The plurality of inputs are combinatorially processed through corresponding lookup tables and the associated logic therein. The first LUT region will then transmit output to a storage element dedicated to the first logic element and a storage element shared by the first logic element and the second logic element, as depicted in FIGS. 4 and 5. Similarly, the second LUT region will transmit output to a storage element dedicated to the second logic element and a storage element shared by the first logic element and the second logic element. A multiplexer selects which output is selected to be transmitted to the shared storage element through a select signal value.

In summary, the above-described embodiments provide for sharing a sequential logic element, i.e., a register, between logic elements. In one embodiment, a multiplexer is added to the register support logic so that an output received from any corresponding lookup table may be selected to eventually be stored within the shared register. The embodiments described above break apart the logic element so that the amount and type of combinatorial logic needed may be combined with the amount of sequential elements needed. By sharing a sequential elements between multiple logic elements, the granularity for the sequential elements is reduced to a point where it is analogous to part of a sequential element being dedicated to a logic element, where in the past a sequential element, such as a register was dedicated to a single logic element and not shared. It should be appreciated that the embodiments described herein may be incorporated into the architecture for the Assignee's programmable logic devices, e.g., the CYCLONE and STRATIX family of programmable logic devices. Of course, the embodiments may be incorporated into other programmable logic devices irrespective of the device family.

As used herein programmable logic devices refer to any integrated circuit that may be programmed to perform a desired function and include programmable logic arrays (PLAs), programmable array logic (PAL), field programmable gate arrays (FPGA), complex programmable logic devices (CPLDs), and a wide variety of other logic and memory devices that may be programmed, including a processor having some programmable aspects, e.g., a processor having configurable data stored with a memory. Often, such PLDs are designed and programmed by a design engineer using an electronic design automation tool that takes the form of a software package.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. An integrated circuit, comprising:
   a core region having a plurality of logical array blocks, each of the plurality of logical array blocks include a plurality of logical elements configured to communicate with each other through interconnections defined within each logical array block, the logical elements each containing a look up table (LUT), wherein a LUT of a first logical element and a LUT of a second logical element share a register, and wherein each of the LUT of the first logical element and the LUT of the second logical element output data to a dedicated register.

2. The integrated circuit of claim 1, wherein the register receives output from both the LUT of the first logical element and the LUT of the second logical element.

3. The integrated circuit of claim 1, wherein output from the LUT of the first or the second logical element to the shared register is determined by a configurable random access memory (CRAM) bit.

4. The integrated circuit of claim 1, further comprising;
   support logic providing timing and control data to the register, the support logic communicating with both the LUT of the first logical element and the LUT of the second logical element.

5. The integrated circuit of claim 3, further comprising:
support logic providing timing and control data for each dedicated register; and
support logic providing timing and control data for the shared register, wherein the support logic providing timing and control data for the shared register includes one extra multiplexer as compared to the support logic providing timing and control data for each dedicated register.

6. The integrated circuit of claim 1, wherein additional logical elements share the register through corresponding look up tables.

7. The integrated circuit of claim 1, wherein the integrated circuit comprises a programmable logic device.

8. A logic element (LE) for an integrated circuit, comprising:
an input region for receiving inputs delivered to the LE;
a look up table (LUT) region for manipulating data received from the input region, the LUT region including a plurality of look up tables; and
a sequential region containing storage elements and control logic for storing output from the LUT region, wherein the sequential region includes a first storage element dedicated to the LUT region and a second storage element shared with the LUT region and a LUT region for another LE, the control logic including a first and a second multiplexer wherein each of the first and the second multiplexer employ an output from a corresponding logic gate as a selection signal.

9. The LE of claim 8, further comprising:
a first storage element support logic dedicated to the first storage element; and
a second storage element support logic shared by the LE and the another LE.

10. The LE of claim 9 wherein the second storage element support logic includes a multiplexer receiving an output from the LE and an output from the another LE.

11. The LE of claim 10, wherein a configuration bit of a programmable logic device, of which the LE is integrated into, selects an output of the multiplexer.

12. The LE of claim 8, further comprising:
an output region having a plurality of multiplexers for selecting between combinatorial outputs.

13. The LE of claim 8 wherein CRAM bits are provided as one input to each of the logic gates.

14. The LE of claim 13, wherein each of the logic gates is a NAND gate.

15. The LE of claim 8, wherein the first storage element and the second storage element are flip-flops.

16. The LE of claim 8 wherein the LUT region performs combinatorial processing operations.

17. The LE of claim 8, wherein additional logic elements share the second storage element.

18. The LE of claim 8, wherein the integrated circuit comprises a programmable logic device.

19. A method for sharing a storage element between logical elements of an integrated circuit; comprising:
receiving a plurality of inputs into a first lookup table (LUT) region of a first logic element;
receiving a plurality of inputs into a second LUT region of a second logic element;
combinatorially processing the plurality of inputs through corresponding lookup tables;
transmitting output from the first LUT region to a storage element dedicated to the first logic element;
transmitting output from the first LUT region to a storage element shared by the first logic element and the second logic element; and
transmitting output from the second LUT region to a storage element dedicated to the second logic element.

20. The method of claim 19 further comprising:
gating a selection signal transmitted to a multiplexer selecting between one of output from the first LUT region or the second LUT region for the shared storage element.

21. The method of claim 19, further comprising:
transmitting output from the second LUT region to selection logic for the storage element shared by the first logic element and the second logic element; and
selecting the output from the first LUT region to be stored in the storage element shared by the first logic element and the second logic element.

22. The method of claim 21, wherein the first lookup table and the second lookup table are each configured to receive 6 inputs.

* * * * *